(12) United States Patent
Alimi

(10) Patent No.: US 8,581,633 B2
(45) Date of Patent: Nov. 12, 2013

(54) ANALOG PEAK HOLD CIRCUITS

(75) Inventor: Evropej Alimi, Rockford, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 23 days.

(21) Appl. No.: 13/352,072

(22) Filed: Jan. 17, 2012

(65) Prior Publication Data

US 2013/0181744 A1    Jul. 18, 2013

(51) Int. Cl.
*H03K 5/153* (2006.01)

(52) U.S. Cl.
USPC .............................................. 327/58; 327/93

(58) Field of Classification Search
USPC ...................................... 327/58, 93
See application file for complete search history.

(56) References Cited

U.S. PATENT DOCUMENTS

| | | |
|---|---|---|
| 4,136,558 A | 1/1979 | Lukes et al. |
| 4,686,390 A | 8/1987 | Cleary, Jr. et al. |
| 5,134,313 A | 7/1992 | Umeyama et al. |
| 5,331,208 A * | 7/1994 | Meyer .......................... 327/227 |
| 5,392,218 A | 2/1995 | Emmerich |
| 5,497,069 A | 3/1996 | Shriver et al. |
| 5,689,175 A | 11/1997 | Hanson et al. |
| 6,498,517 B2 | 12/2002 | Miyazaki |
| 6,535,033 B2 | 3/2003 | Yamauchi et al. |
| 8,063,667 B2 | 11/2011 | Tomita |
| 2002/1004773 | 4/2002 | Akahori |

* cited by examiner

*Primary Examiner* — John Poos
(74) *Attorney, Agent, or Firm* — Cantor Colburn LLP

(57) ABSTRACT

A peak hold circuit includes an input node configured to receive an input waveform, a peak hold component coupled to the input node and configured to sample and hold a peak value of the input waveform at a peak value node, a reset node configured to receive a reset signal, a reset circuit coupled to the peak hold component and the reset node, the reset circuit configured to reset the peak hold value, and a voltage clamp coupled to the input node, the reset circuit, and the reset node, the voltage clamp configured to clamp the input node in response to the reset signal.

8 Claims, 2 Drawing Sheets

ANALOG PEAK HOLD CIRCUITS

BACKGROUND OF THE INVENTION

Generally, the present invention is related to circuits, and more particularly, exemplary embodiments of the present invention are related to analog peak hold circuits.

A peak hold circuit is an electrical circuit designed to capture and hold a peak value of an input signal. The peak value of the input signal is typically measured at a fixed interval based upon design limitations. Conventionally, two main configurations for peak hold circuitry are used, a reset peak hold configuration and a resistor-capacitor (RC) discharge hold configuration. During actual use, the conventional reset peak hold configuration can suffer from voltage overshoot generated by the reset mechanism and the RC discharge hold configuration can suffer from decay dependent upon the RC constant of the implemented components.

BRIEF DESCRIPTION OF THE INVENTION

According to an exemplary embodiment of the present invention, a peak hold circuit includes an input node configured to receive an input waveform, a peak hold component coupled to the input node and configured to sample and hold a peak value of the input waveform at a peak value node, a reset node configured to receive a reset signal, a reset circuit coupled to the peak hold component, and a voltage clamp coupled to the input node and the reset circuit, an input node configured to receive an input waveform, a clamp coupled to the input waveform and a reset signal, a peak hold component coupled to the input, a reset circuit coupled to the peak hold component and the reset signal.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION OF THE INVENTION

According to exemplary embodiments of the present invention, an analog peak hold circuit topology is provided which may reduce one or more errors associated with conventional peak hold circuitry. The technical effects and benefits of exemplary embodiments of the present invention include an increased bandwidth, higher accuracy, lower signal detection and faster reset operations while holding analog peak values of an input waveform.

Figure 1:
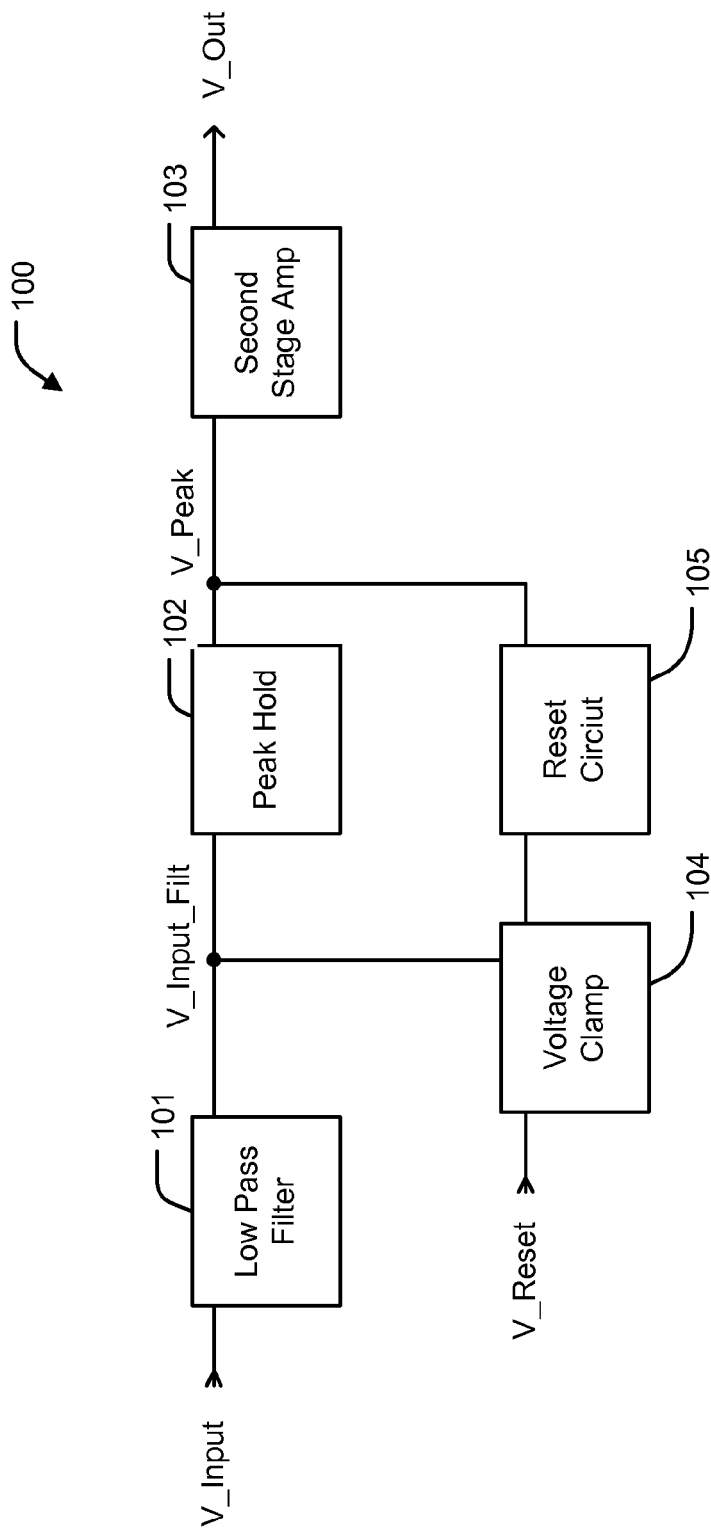
FIG. 1 is a schematic of a peak hold circuit, according to an exemplary embodiment of the present invention.

Turning to FIG. 1, a schematic of a peak hold circuit 100 is illustrated. As illustrated, the circuit 100 includes a filter 101 that receives an input voltage at an input node V_Input.

The filter 101 is configured to attenuate frequencies contained in V_Input which are outside of a desired range or required bandwidth. Thus, the circuit 100 will only respond to frequencies of interest. Furthermore, through the use of the filter 101, frequency content associated with interference may also be attenuated.

In considering design values for the filter 101, a slew rate of any associated operational amplifiers (opamp) within the circuit 100 should be considered, as well as the bandwidth of the opamps, before considering an appropriate pole for the filter 101. This will ensure that the loop response is higher than any input signal of interest. Also, although the pole of the filter 101 may be an order of magnitude higher, signals will still get attenuated and the effect of such attenuation should be considered.

Turning back to FIG. 1, the circuit 100 further includes peak hold component 102 in electrical communication with the filter 101. The peak hold component 102 includes sampling circuitry configured to sample and hold a peak value of a waveform filtered through filter 101, and output the peak value at peak value node V_Peak.

The circuit 100 further includes second stage amplification 103 in communication with the peak hold component 102. The second stage amplification 103 is configured as a voltage follower of the node V_Peak, and therefore provides a buffered peak value at an output node V_Out and also provides feedback to peak hold component 102. The selection of the second stage amplification is critical and directly effects the performance of the peak hold component 102.

The circuit 100 further includes voltage clamp 104 in serial communication with reset circuit 105. The serial configuration of voltage clamp 104 and reset circuit 105 are arranged in parallel with the peak hold component 102. Therefore, as a reset signal is received at reset node V_Reset, a filtered input of the peak hold component 102 is clamped by voltage clamp 104 and the peak value held through peak hold component 102 is reset by reset circuit 105. As such, there is reduced gain error associated with the peak hold component 102 during a reset operation. Furthermore, as the overall error is reduced, a peak hold capacitance integrated within the peak hold component 102 may be reduced, thereby allowing for a higher frequency bandwidth of operation for the entire circuit 100.

Accordingly, as described above, a peak hold circuit according to exemplary embodiments of the present invention includes at least a voltage clamp 104 coupled to an input of peak hold component 102 and a reset circuit 105. Thus, an input voltage is clamped during a reset operation which reduces an error of the circuit 100 and allows for an increase in bandwidth.

Hereinafter, a more detailed example of the circuit 100 is described with reference to FIG. 2.

Figure 2:
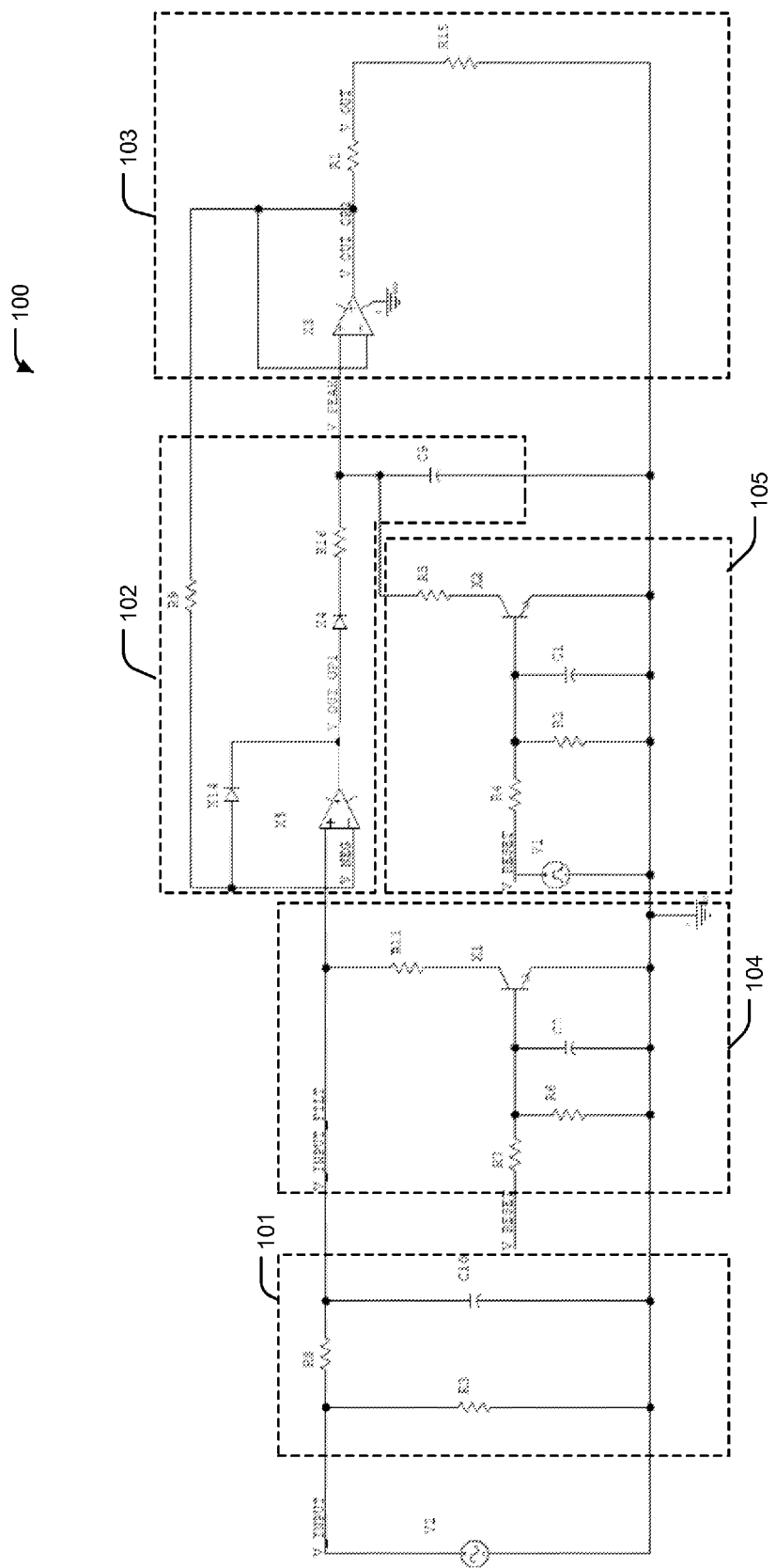
FIG. 2 is a more detailed example of the peak hold circuit of FIG. 1.

Turning to FIG. 2, 101 includes a low pass filter comprised with R8 and C10 in this example to attenuate frequencies which are not of interest. R3 is incorporated to reduce susceptibility to leakage currents and to allow C10 to discharge at a controlled rate. R8 should be of the same value as R9 to reduce error generated by bias currents.

Turning back to FIG. 2, the peak hold component 102 further includes blocking diode X4. The blocking diode X4 is configured to block peak hold capacitor C9 from discharging. The diode X4 also rectifies the input signal V_Input_Filt such that the peak hold capacitor C9 only encounters positive peaks. It is important to note that this configuration is nonlinear and may contribute to the opamp X5 overshooting an input value. In one embodiment, blocking diode X4 may be embodied as Schottky diodes for a softer or smoother turn on. X14 ensures that during input levels lower than the current peak do not drive X5 into deep saturation and keep the voltage level at one diode drop below the peak.

The peak hold component 102 further include resistor R16 coupled between diode X4 and peak hold capacitor C9. Resistor R16 is configured to control the output current of the opamp X5. A secondary effect of resistor R16 is that it forms a low pass filter on node V_Peak with peak hold capacitor C9. The associated pole frequency should be taken into consideration when choosing the values of R16 and C9. This pole also introduces a phase shift on the output V_Out. However, this effect is not an issue in implementations which need to capture a peak from multiple periods or a fixed time frame which exceeds the period of the input signal. R16 also ensures the stability of X5 by limiting the maximum output current. R9 is configured to provide feedback to X5 and keep X5 in a closed loop operation.

According to FIG. 2, second stage amplification 103 is configured as a voltage follower of peak hold component 102, and includes opamp X3 and resistor R1. Resistor R1 is configured to protect the op amp X3 from downstream failures. This impedance can also be used to protect downstream logic (not illustrated) in the case of opamp failure. Resistor 15 is further included, coupled between resistor R1 and ground as an illustration of a load downstream.

Turning back to FIG. 2, reset circuit 105 includes resistors R2, R4, and R5, arranged about mechanism X2 and capacitor C1. During a reset operation, for example if a V_Reset signal is asserted, capacitor C9 is discharged to a lower value thereby resetting peak hold component 102. The lower reset value is a function of resistors R16 and R5, and transistor X2. Resistor R5 limits the discharge rate of capacitor C9 and ensures X2 limits are never exceeded. R4 and R2 ensure proper operation of X2 under all thermal conditions. C1 ensures a response only to required frequencies.

To counter act an overshoot effect from the lower reset value described above, voltage clamp 104 includes clamping mechanism X1 coupled to the input node V_Input_Filt such that the output of the opamp X5 is driven close to zero or low during a reset operation. In this case, there will be minimal overshoot from the opamp X5 during the reset and the reset can be driven at a much lower value. It follows that this clamping operation, in response to the reset signal, allows for a smaller value of peak hold capacitor C9. C2 should be an order of magnitude or larger than C1 so that the clamp is released after the reset cycle. Resistor R11 can be incorporated to limit the current during the clamping event. Resistors R7 and R6 ensure proper operation of X1 under all thermal conditions. C2 ensures a response only to required frequencies.

As described above, exemplary embodiments provide analog peak hold circuits employing a voltage clamp during reset operations to reduce error, drive reset voltages of peak hold capacitances lower, and increase a bandwidth of operation. The peak hold circuits may include active components such as operational amplifiers, and may further employ at least one passive resistor-capacitor (RC) low pass filter to attenuate an input sinusoid. The voltage clamp may include a clamping device such as a transistor, field effect transistor, integrated gate base transistor or in general any analog or mechanical switch responsive to a reset signal.

Although not described or illustrated, it should be understood that the analog peak hold circuits described above may be used singularly or in combination with a plurality of other circuits and/or components, to form any desired range of sampling devices. Moreover, it should be understood that although not particularly illustrated, any active components and associated transistors require a voltage bias and power source, and any reset signals may be applied externally through an automatic circuit or microcontroller.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A peak hold circuit, comprising:
an input node configured to receive an input waveform;
a peak hold component coupled to the input node and configured to sample and hold a peak value of the input waveform at a peak value node;
a reset node configured to receive a reset signal;
a reset circuit coupled to the peak hold component;
a voltage clamp coupled to the input node and the reset circuit;
an output node; and
a secondary stage amplification component coupled to the peak value node and the output node, the secondary stage amplification component configured as a voltage follower of the peak value node.

2. The circuit of claim 1, further comprising a filter coupled to the input node, the filter configured to filter frequency components of the input waveform.

3. The circuit of claim 1, wherein the peak hold component comprises an active peak hold component.

4. The circuit of claim 3, wherein the active peak hold component is an operational amplifier (opamp).

5. The circuit of claim 1, wherein the peak hold component comprises a peak hold capacitor coupled to the peak value node.

6. The circuit of claim 5, wherein the reset circuit comprises a reset mechanism coupled to the peak hold capacitor and configured to reset the peak hold value.

7. The circuit of claim 1, wherein the voltage clamp comprises a clamping mechanism coupled to the input node and the reset node, the clamping mechanism configured to clamp the input node to ground in response to the reset signal.

8. The circuit of claim 1, further comprising:
a filter coupled to the input node, the filter configured to filter frequency components of the input waveform, wherein
the secondary stage amplification component includes an operational amplifier (opamp),
the peak hold component comprises an operational amplifier (opamp) and a peak hold capacitor coupled to the peak value node,
the reset circuit comprises a reset mechanism coupled to the peak hold capacitor, and
the voltage clamp comprises a clamping mechanism coupled to the input node and the reset node, the clamping mechanism configured to clamp the input node to ground in response to the reset signal.

* * * * *